United States Patent
Matsuo et al.

(10) Patent No.: US 8,394,558 B2
(45) Date of Patent: Mar. 12, 2013

(54) REFLECTION TYPE PHOTOMASK BLANK, MANUFACTURING METHOD THEREOF, REFLECTION TYPE PHOTOMASK, AND MANUFACTURING METHOD OF SEMICONDUCTOR DEVICE

(75) Inventors: Tadashi Matsuo, Saitamaken (JP); Koichiro Kanayama, Kitakatsushika-gun (JP); Shinpei Tamura, Ichihara (JP)

(73) Assignee: Toppan Printing Co., Ltd., Tokyo (JP)

( * ) Notice: Subject to any disclaimer, the term of this patent is extended or adjusted under 35 U.S.C. 154(b) by 0 days.

(21) Appl. No.: 12/232,757

(22) Filed: Sep. 23, 2008

(65) Prior Publication Data
US 2009/0042110 A1 Feb. 12, 2009

Related U.S. Application Data

(63) Continuation of application No. PCT/JP2006/324368, filed on Dec. 6, 2006.

(30) Foreign Application Priority Data

Mar. 30, 2006 (JP) ................................ P2006-093304
Sep. 15, 2006 (JP) ................................ P2006-251160

(51) Int. Cl.
*G03F 1/08* (2006.01)
*H01L 21/02* (2006.01)

(52) U.S. Cl. ........................................... 430/5; 430/311

(58) Field of Classification Search ............... 430/5, 311
See application file for complete search history.

(56) References Cited

U.S. PATENT DOCUMENTS

| | | | |
|---|---|---|---|
| 6,013,399 A * | 1/2000 | Nguyen | 430/5 |
| 6,449,086 B1 | 9/2002 | Singh | |
| 6,596,465 B1 | 7/2003 | Mangat et al. | |
| 2002/0045108 A1 | 4/2002 | Lee et al. | |
| 2003/0064296 A1 | 4/2003 | Yan | |
| 2003/0198874 A1 | 10/2003 | Lee | |
| 2004/0196579 A1 | 10/2004 | Shoki | |
| 2004/0253426 A1 * | 12/2004 | Yakshin et al. | 428/212 |
| 2005/0238963 A1 * | 10/2005 | Ishibashi et al. | 430/5 |
| 2005/0282072 A1 * | 12/2005 | Hector et al. | 430/5 |
| 2006/0270226 A1 * | 11/2006 | Hosoya | 438/686 |
| 2007/0160913 A1 | 7/2007 | Stehle | |

FOREIGN PATENT DOCUMENTS

| | | |
|---|---|---|
| EP | 1 260 862 A1 | 11/2002 |
| EP | 1 333 323 A | 8/2003 |
| EP | 1 498 936 A1 | 1/2005 |
| FR | 2 865 813 A | 8/2005 |

(Continued)

OTHER PUBLICATIONS

Machine Translation of JP 2006-013280 A, Jan. 12, 2006.*

(Continued)

*Primary Examiner* — Jonathan Jelsma

(57) ABSTRACT

A reflection type photomask blank includes: a substrate; a multilayer reflection film formed on the substrate for reflecting exposure light; a protection film formed on the multilayer reflection film for protecting the multilayer reflection film; an absorber layer for absorbing the exposure light on the protection film; and a shock absorbing film formed between the absorber layer and the protection film, with a resistance to etching which is performed when an exposure transfer pattern of the absorber layer is formed, in which the protection film is: a compound including Zr and Si; a compound including Zr, Si, and at least either one of O and N; or a single element or a compound including at least any one of Ru, C, and Y.

10 Claims, 5 Drawing Sheets

FOREIGN PATENT DOCUMENTS

| | | |
|---|---|---|
| JP | 07-045499 | 2/1995 |
| JP | 7-45499 | 2/1995 |
| JP | 2001-237174 | 8/2001 |
| JP | 2002-122981 | 4/2002 |
| JP | 2004-342734 | 12/2004 |
| JP | 2004-363570 | 12/2004 |
| JP | 2006-13280 | 1/2006 |
| JP | 2006-013280 | 1/2006 |
| JP | 2006-228767 | 8/2006 |

OTHER PUBLICATIONS

Machine Translation of JP 2004-342734.*

Kanayama K. et al., "ZrSiON as a material for high transmittance attenuated PSM" Proceedings of the SPIE—The International Society for Optical Engineering SPIE—Int. Soc. Opt. Eng USA, vol. 4409, 2001, pp. 147-154.

European Search Report issued on Mar. 23, 2009 in corresponding European Patent Application 06834123.9.

European Office Action dated Mar. 7, 2011 in corresponding European Patent Application 06 834 123.9.

Japanese Notice of Allowance mailed Feb. 7, 2012 issued in corresponding Japanese Patent Application No. 2006-251160.

* cited by examiner

OPTICAL CONSTANT AT EUV WAVELENGTH (13.5 nm)

THICKNESS OF ZrSiO (DUAL-USE FILM UPPER LAYER) (nm)
WHERE THICKNESS OF ZrSi (DUAL-USE FILM LOWER LAYER) = T (nm)

REFLECTION TYPE PHOTOMASK BLANK, MANUFACTURING METHOD THEREOF, REFLECTION TYPE PHOTOMASK, AND MANUFACTURING METHOD OF SEMICONDUCTOR DEVICE

CROSS REFERENCE TO RELATED APPLICATIONS

This application is a continuation application filed under 35 U.S.C. 111(a) claiming the benefit under 35 U.S.C. 120 and 365(c) of PCT International Application No. PCT/JP2006/324368, filed Dec. 6, 2006, which claimed priority to Japanese Application No. 2006-093304, filed Mar. 30, 2006, and Japanese Application No. 2006-251160, filed Sep. 15, 2006, in the Japanese Patent Office, the disclosures of which are hereby incorporated by reference.

TECHNICAL FIELD

The present invention relates to a reflection type photomask blank for use in the manufacture, etc. of semiconductor devices and a manufacturing method thereof, a reflection type photomask, and a manufacturing method of a semiconductor device in a photolithography technique. More particularly, the present invention relates to a photolithography technique using extreme ultraviolet light in the soft X-ray region, that is, EUV light.

BACKGROUND ART

In the conventional manufacture of semiconductor elements, for transferring a necessary pattern onto a Si substrate by the photolithography technique, a lamp light source (wavelength: 365 nm) or an excimer laser light source (KrF (wavelength: 248 nm), ArF (wavelength: 193 nm)) has been used as a light source. In more highly integrated semiconductor elements of recent years, there is an accelerating trend in microsizing a necessary pattern transfer onto a Si substrate. It is especially urgently needed to establish a new photolithography technique capable of micromachining at 100 nm or less. Consequently, a photolithography technique using an F2 laser light (wavelength: 157 nm), which is an excimer laser light with a shorter wavelength region, is now being developed.

However, because a substantial limit for resolution is typically a half size of the wavelength of the exposure light, it is assumed that machining at approximately 70 nm is the limit even if the F2 laser light is used. Therefore, it is desired that a photolithography technique using the EUV light (wavelength: 13.5 nm), which has a wavelength shorter than that of the F2 laser light by as many as one or more orders of magnitude as its light source, be developed.

In an EUV lithography technique using the EUV light, exposure by a reflection optical system is used. This is because a substance in the wavelength region of the EUV light has a refractive index of slightly less than 1, which prevents use of a refractive optical system as is used for conventional exposure light sources. Furthermore, whereas a transmission photomask is used for a conventional pattern transfer, a reflection type photomask is used in the wavelength region of the EUV light because most of the substances have high light absorbance.

As a reflection type photomask for use in such an EUV lithography method, there is proposed one which uses a reflection type photomask blank made of: a multilayer reflection film formed on a substrate, capable of reflecting EUV light; and an absorber layer formed on the multilayer reflection film and formed of a material with high absorbance of the EUV light (for example, Patent Document 1). To be more specific, the multilayer reflection film has a configuration in which two or more types of material layers whose refractive indices for the EUV light are significantly different from each other are cyclically laminated. Furthermore, the absorber layer is a lamination of layers including a tantalum nitride and layers including a tantalum. After the absorber layer is etched into a predetermined pattern, the EUV light is reflected on the multilayer reflection film with the predetermined pattern, enabling a pattern transfer onto the Si substrate. Patent Document 1: Japanese Unexamined Patent Application, First Publication No. 2001-237174.

DISCLOSURE OF INVENTION

Problems to be Solved by the Invention

However, the reflection type photomask blank of Patent Document 1 causes damage to the surface portion of the multilayer reflection film underneath the absorber layer due to the etching performed when the exposure transfer pattern of the absorber layer is formed. This poses a problem of decreasing reflectivity.

Means for Solving the Problems

The present invention has been achieved in view of the above circumstances, and provides: a reflection type photomask blank capable of preventing a decrease in reflectivity when an absorber layer is etched to form an exposure transfer pattern and a manufacturing method thereof; a reflection type photomask in which an exposure transfer pattern is formed on such the reflection type photomask blank; and a manufacturing method of a semiconductor device.

In order to solve the above problem, the present invention proposes the following:

A reflection type photomask blank according to the present invention includes: a substrate; a multilayer reflection film formed on the substrate for reflecting exposure light; a protection film formed on the multilayer reflection film for protecting the multilayer reflection film; an absorber layer for absorbing the exposure light on the protection film; and a shock absorbing film formed between the absorber layer and the protection film, having a resistance to etching which is performed when an exposure transfer pattern of the absorber layer is formed, in which the protection film is: a compound including Zr and Si; a compound including Zr, Si, and at least either one of O and N; or a single element or a compound including at least any one of Ru, C, and Y.

Furthermore, a manufacturing method of a reflection type photomask blank according to the present invention provided with: a substrate; a multilayer reflection film for reflecting exposure light; and an absorber layer for absorbing the exposure light, including: a multilayer reflection film formation step of forming the multilayer reflection film on the substrate; a protection film formation step of forming a protection film on the multilayer reflection film by performing a sputtering with a target of a Zr—Si alloy, Ru, or Y in an inert gas atmosphere or in a mixed gas atmosphere including an inert gas and at least any one of oxygen and nitrogen, or by performing a CVD with a compound including C as a material gas; a shock absorbing film formation step of forming a shock absorbing film on the protection film by performing a sputtering with a target formed from a material having a resistance to an etching which is performed when an exposure transfer pattern of the absorber layer is formed; and an absorber layer formation step of forming the absorber layer on the shock absorbing film.

According to these reflection type photomask blanks, when the absorber layer is etched to form the exposure transfer pattern, the etching-resistant shock absorbing film which is formed underneath the absorber layer functions as an etching stopper. Therefore, damage due to the etching can be prevented from reaching the lower layer. Furthermore, when the exposed shock absorbing film is removed with etching, the protection film, which is formed from: a compound including Zr and Si; a compound including Zr, Si, and at least either one of O and N; or a single element or a compound including at least any one of Ru, C, and Y, functions as an etching stopper. Therefore, damage due to the etching can be prevented from reaching the multilayer reflection film, and a decrease in reflectivity of the multilayer reflection film can be prevented.

Furthermore, in the above-mentioned reflection type photomask blank, it is preferable that the protection film and the shock absorbing film be formed as a single-layer dual-use film which serves both as the protection film and as the shock absorbing film, the dual-use film being: a compound including Zr and Si; a compound including Zr, Si, and at least either one of O and N; or a single element or a compound including at least any one of Ru, C, and Y.

Furthermore, a reflection type photomask blank according to the present invention includes: a substrate; a multilayer reflection film formed on the substrate for reflecting exposure light; an absorber layer formed above the multilayer reflection film for absorbing the exposure light; and a single-layer dual-use film formed between the multilayer reflection film and the absorber layer for protecting the multilayer reflection film, with a resistance to etching which is performed when an exposure transfer pattern of the absorber layer is formed, in which the dual-use film is: a compound including Zr and Si; a compound including Zr, Si, and at least either one of O and N; or a single element or a compound including at least any one of Ru, C, and Y.

Furthermore, a manufacturing method of a reflection type photomask blank according to the present invention provided with: a substrate; a multilayer reflection film for reflecting exposure light; and an absorber layer for absorbing the exposure light, including: a multilayer reflection film formation step of forming the multilayer reflection film on the substrate; a dual-use film formation step of forming a dual-use film on the multilayer reflection film by performing a sputtering with a target of a Zr—Si alloy, Ru, or Y in an inert gas atmosphere or in a mixed gas atmosphere including an inert gas and at least any one of oxygen and nitrogen, or by performing a CVD with a compound including C as a material gas; and an absorber layer formation step of forming the absorber layer on the dual-use film.

According to these reflection type photomask blanks, the dual-use film is formed from: a compound including Zr and Si; a compound including Zr, Si, and at least either one of O and N; or a single element or a compound including at least any one of Ru, C, and Y. Therefore, damage to the multilayer reflection film when the absorber layer is etched can be prevented. In addition, the dual-use film can be a single-layered film, allowing the deposition process to be simplified and the film to be thinner.

Furthermore, the dual-use film has a transparency for the EUV light. Therefore, even if the dual-use film is provided, it does not contribute to a decrease in reflectivity of the multilayer film in practical use. Consequently, the dual-use film need not be removed after patterning the absorber layer. This brings about an effect in that a step of delaminating the shock absorbing film and of checking and modifying the pattern of the absorption layer after delamination of the shock absorbing film can be omitted. At this time, the pattern is formed only on the absorber layer because the configuration is without the shock absorbing film. As a result, the portion on which the pattern is formed can be made thin. In the reflection type photomask, the EUV light is incident and reflected with an angle. Therefore, the thinner the portion on which the pattern is formed is, the more accurately the pattern is transferred.

Furthermore, in the above-mentioned photomask blank provided with the dual-use film, it is preferable that a plurality of the dual-use films be provided.

Furthermore, a manufacturing method of a reflection type photomask blank according to the present invention provided with: a substrate; a multilayer reflection film for reflecting exposure light; and an absorber layer for absorbing the exposure light, including: a multilayer reflection film formation step of forming the multilayer reflection film on the substrate; a dual-use film formation step of laminating a plurality of dual-use films on the multilayer reflection film, the dual-use films being formed by performing a sputtering with a target of a Zr—Si alloy, Ru, or Y in an inert gas atmosphere or in a mixed gas atmosphere including an inert gas and at least any one of oxygen and nitrogen, or by performing a CVD with a compound including C as a material gas; and an absorber layer formation step of forming the absorber layer on the dual-use film.

According to these reflection type photomask blanks, the photomask blank has plural layers of dual-use films, providing a flexible response to the resistance and the transmittance required of the dual-use film. For example, a layer of a material with high resistance to etching and modification is formed as a layer immediately underneath an absorption film, and a layer of a material with high transmittance for the EUV light is formed as an underlayer thereof. Thereby, etching damage to the multilayer reflection film when the absorber layer is patterned and when the pattern is modified can be prevented, and a property of suppressing a decrease in reflectivity of the reflection region can be obtained.

Furthermore, in the above-mentioned reflection type photomask blank, it is preferable that the dual-use film have an etching rate of 1/20 or less than that of the absorber layer when the absorber layer is etched to form an exposure transfer pattern.

According to this reflection type photomask blank, the dual-use film has an etching rate 1/20 or less than that of the absorber layer. This minimizes damage to the dual-use film when the absorber layer is etched. That is, this can prevent damage to the underlying multilayer reflection film.

Furthermore, in the above-mentioned reflection type photomask blank, it is preferable that a topmost layer of the plural layers of the dual-use films have an etching rate when the absorber layer is etched to form an exposure transfer pattern 1/20 or less than that of the absorber layer.

According to this reflection type photomask blank, the topmost layer of the dual-use film has an etching rate 1/20 or less than that of the absorber layer. This minimizes damage to the topmost layer of the dual-use film when the absorber layer is etched. That is, this can prevent damage to the lower layer portion of the dual-use film which lies thereunder and to the multilayer reflection film.

Furthermore, in the reflection type photomask according to the present invention, an exposure transfer pattern is formed by etching an absorber layer of the above-mentioned reflection type photomask blank.

Furthermore, in a reflection type photomask according the present invention, an exposure transfer pattern is formed by etching an absorber layer of a reflection type photomask blank which is manufactured with the above-mentioned manufacturing method of a reflection type photomask blank.

According to these reflection type photomasks, there is formed a reflection region with favorable reflectivity in the region where the absorber layer is etched. As a result, irradiation of exposure light enables a pattern transfer with a favorable contrast, due to this reflection region and the absorber layer.

Furthermore, a manufacturing method of a semiconductor device according to the present invention includes a transfer step of transferring the pattern of the absorber layer of the reflection type photomask onto a resist layer provided on a semiconductor substrate by irradiating extreme ultraviolet light as the exposure light onto the above-mentioned reflection type photomask to expose reflected light reflected on the multilayer reflection film of the reflection type photomask onto the resist layer.

According to this semiconductor device manufacturing method, extreme ultraviolet light is irradiated onto the above-mentioned reflection type photomask in the transfer step, to thereby enable a micromachining at 70 nm or less.

Advantageous Effect of the Invention

According to the reflection type photomask blank and the manufacturing method of the reflection type photomask blank, a shock absorbing film and a protection film are provided, making it possible to prevent a decrease in reflectivity when an absorber layer is etched to form an exposure transfer pattern.

Furthermore, according to the reflection type photomask of the present invention, damage to a multilayer reflection film can be prevented to obtain a favorable reflectivity, enabling pattern transfer with a favorable contrast.

Furthermore, according to the reflection type photomask of the present invention, a dual-use film which serves both as a protection film and as a shock absorbing film is provided, bringing about an effect in that a step of delaminating a shock absorbing film and of checking and modifying the pattern of the absorption layer after delamination of the shock absorbing film can be omitted.

Furthermore, according to the manufacturing method of a semiconductor device of the present invention, a pattern transfer is performed in a transfer pattern step using such a reflection type photomask, making it possible to manufacture a semiconductor device subjected to micromachining at 70 nm or less which corresponds to the wavelength of the EUV light as exposure light.

DESCRIPTION OF THE REFERENCE SYMBOLS

1: substrate, 2: multilayer reflection film, 3: protection film, 4: shock absorbing film, 4a: shock absorbing film in exposed region, 4b: shock absorbing film pattern, 44: surface of shock absorbing film in exposed region, 5: absorber layer, 5a: absorber layer pattern, 6: resist layer, 6a: resist pattern, 31: dual-use film, 31a: dual-use film upper layer, 31b: dual-use film lower layer, 311, 312: reflection region exposed after removal of absorber layer, 33: exposed reflection region, 10, 20, 50: reflection type photomask blank, 30, 40, 60: reflection type photomask

BEST MODE FOR CARRYING OUT THE INVENTION

First Embodiment

Figure 1:
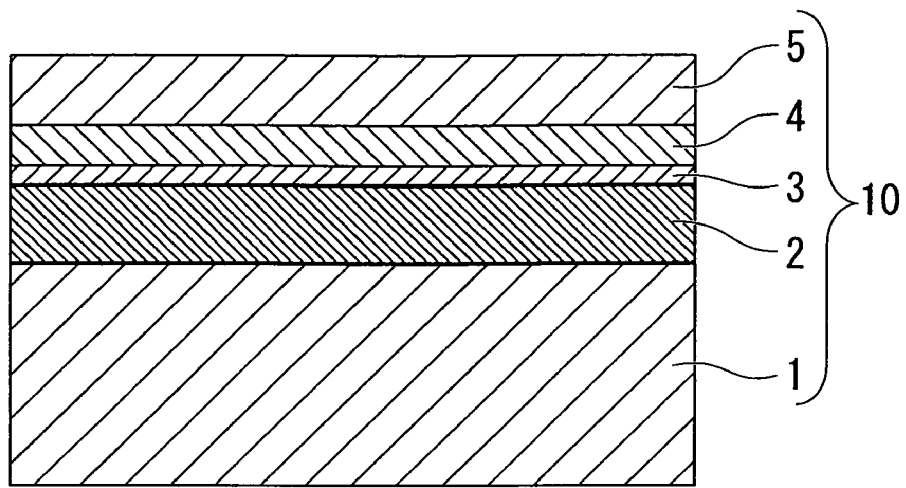
FIG. 1 is a cross-sectional view of a reflection type photomask blank of a first embodiment according to the present invention.
Figure 2:
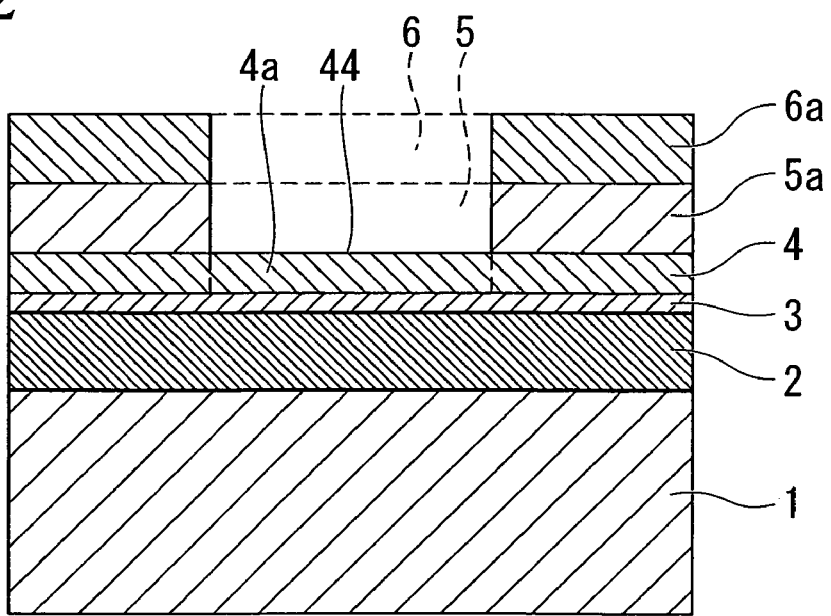
FIG. 2 is a diagram for explaining manufacturing steps of a reflection type photomask of the first embodiment according to the present invention.
Figure 3:
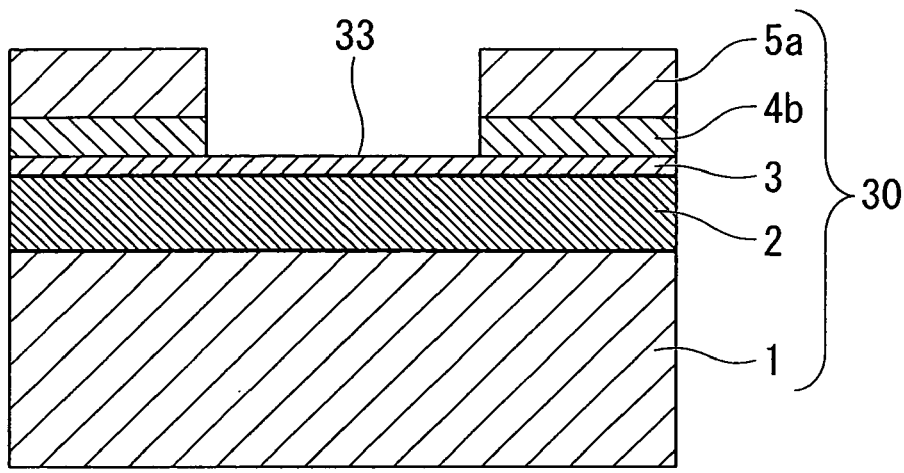
FIG. 3 is a cross-sectional view of the reflection type photomask of the first embodiment according to the present invention.

FIG. 1 to FIG. 3 show an embodiment according to the present invention. As shown in FIG. 1, a reflection type photomask blank 10 includes: a substrate 1; a multilayer reflection film 2 formed on the substrate 1; a protection film 3 formed on the multilayer reflection film 2; a protection film 3 formed on the multilayer reflection film 2; a shock absorbing film 4 formed on the protection film 3; and an absorber layer 5 formed on the shock absorbing film 4. To be more specific, the substrate 1 is a Si substrate, a synthetic quartz substrate, or the like. The multilayer reflection film 2 is one that reflects EUV light (extreme ultraviolet light), which is exposure light. A multilayer film with a combination of materials whose refractive indices for EUV light are significantly different is used therefor. For example, the multilayer reflection film 2 is formed by laminating approximately 40 cycles of layers with a combination such as Mo and Si, or Mo and Be.

The absorber layer 5 is one which absorbs irradiated EUV light when it is dry-etched to be formed into a predetermined exposure transfer pattern as will be described later. Hence, it is selected from among heavy metals with high absorbance for the EUV light. For such a heavy metal, an alloy based on Ta can be favorably used. Furthermore, an amorphous state of the absorber layer 5 is favorable for the purpose of obtaining an absorber layer surface with high smoothness, or performing an anisotropic etching on the absorber layer by dry etching. For example, in the case of Ta, if it is made into an alloy with an appropriate amount of Si (hereinafter referred to as TaSi-based absorber), it is allowed to be amorphous.

The shock absorbing film 4 is formed from a material with resistance to the dry etching performed when the exposure transfer pattern of the absorber layer 5 is formed. It functions as an etching stopper for preventing damage to a lower layer when the absorber layer 5 is etched. For example, it is formed by the sputtering with a target of Ru.

The protection film 3 protects the multilayer reflection film 2. It functions as an etching stopper for preventing damage to the multilayer reflection film 2 when the shock absorbing film 4 is etched and removed. The protection film 3 is formed from: a compound including Zr and Si (hereinafter referred to as ZrSi); a compound including Zr, Si, and at least either one of O and N (hereinafter referred to as ZrSiO and ZrSiN); or a single element or a compound including at least any one of Ru, C, and Y (hereinafter referred to as Ru, C, and Y). As will be described later, when the absorber layer 5 and the shock absorbing film 4 are dry-etched, it is performed in an etching atmosphere mainly composed of a chlorine gas, which has a high etching rate. All of ZrSi, ZrSiO, ZrSiN, Ru, C, and Y under this etching environment have a favorable resistance property. TABLE 1 shows etching selection ratios of the TaSi-based absorber to the compounds of ZrSi, ZrSiO, and ZrSiN, respectively, under a TaSi-based absorber etching atmosphere. As shown in TABLE 1, the etching selection ratios of the TaSi-based absorber can be high to all the ZrSi-based compounds, that is, ZrSi, ZrSiO, and ZrSiN. They have a selectivity of over 20.

TABLE 1

| To ZrSi | To ZrSiO | To ZrSiN |
|---------|----------|----------|
| 20.38   | 26.50    | 31.18    |

When formed from for example ZrSi, such a protection film 3 is formed by performing a sputtering with a target of a Zr—Si alloy in an inert gas atmosphere such as Ar. When formed from ZrSiO or ZrSiN, it is formed by performing a sputtering with a target of a Zr—Si alloy in a mixed gas atmosphere of an inert gas such as Ar, and oxygen or nitrogen. When formed from Ru or Y, it is formed by performing a sputtering with a target of Ru or Y in an inert gas atmosphere such as of Ar. Furthermore, when formed from C, it is formed by subjecting a material gas to a CVD.

Then, as shown in FIG. 2 and FIG. 3, the absorber layer 5 and the shock absorbing film 4 of such a reflection type photomask blank 10 is dry-etched in an etching atmosphere mainly composed of a chlorine gas as described above, to thereby fabricate a reflection type photomask 30 with an exposure transfer pattern in the absorber layer 5. Hereunder are a detailed description of the reflection type photomask blank 10 of the present embodiment and a manufacturing method thereof, and a detailed description of the manufacture of the reflection type photomask 30, based on Example 1.

Example 1

In the reflection type photomask blank 10 shown in FIG. 1, a synthetic quartz four inches square and 0.25 inches thick whose surface was ground flat was used as a substrate 1. Then, as a multilayer reflection film formation step, Mo and Si were alternately laminated on the substrate 1 for approximately 40 cycles by the DC magnetron sputtering, to thereby fabricate a multilayer reflection film 2 such that its reflectivity is maximized for the EUV light in a wavelength region of 13 to 14 nm. At this time, one cycle of the film made from Mo and Si had a thickness of 7 nm, in which the Mo film had a thickness of 2.8 nm and the Si film had a thickness of 4.2 nm.

Next, as a protection film formation step, a protection film 3 was formed on the multilayer reflection film 2 by the DC magnetron sputtering. That is, a Zr—Si alloy target whose ratio of Zr to Si is 1:3 was used as a sputtering target. To this Zr—Si alloy target, 300 W DC was applied under an Ar atmosphere with a gas pressure of 0.25 Pa, to thereby deposit a film made from ZrSi with a thickness of 10 nm.

Next, as a shock absorbing film formation step, a shock absorbing film 4 was formed on the protection film 3 by DC magnetron sputtering. That is, an Ru target to which 300 W DC was applied under an Ar atmosphere with a gas pressure of 0.25 Pa was used to deposit a film made from Ru with a thickness of 4 nm.

Finally, as an absorber layer formation step, an absorber layer 5 was formed on the shock absorbing film 4 by the DC magnetron sputtering. The absorber layer 5 was made of two layers. First, by a two-target sputtering using a Ta—Si alloy target and a Ta target in an Ar atmosphere, a film with a thickness of 75 nm was deposited. Subsequently, by a two-target sputtering using a Ta target and a Si target in a mixed gas atmosphere of Ar/$O_2$/$N^2$, a film with a thickness of 27 nm was deposited.

Thus, the reflection type photomask blank 10 was obtained. At this time, the topmost surface of the mask blank in the absorber layer 5 had a surface roughness of 0.38 nmRms, and hence had a favorable surface smoothness. Furthermore, the absorber layer 5 had a reflectivity of 2.15% at a wavelength of 193 nm, and a reflectivity of 1.21% at a wavelength of 257 nm. Therefore, a sufficiently low reflectivity property in the DUV light wavelength region for a test was obtained.

Next is a detailed description of manufacturing the reflection type photomask 30 by forming an exposure transfer pattern in the absorber layer 5 of the reflection type photomask blank 10. First, as shown in FIG. 2, a positive electron beam resist (FEP-171 manufactured by FUJIFILM Arch Co., Ltd.) was coated on the absorber layer 5 to form a resist layer 6. Next, through the lithography steps of EB drawing and development, a resist pattern 6a was formed. Furthermore, by use of this resist pattern 6a as a mask, the absorber layer 5 was etched by a dry etching apparatus of an ICP discharge type, to thereby obtain an absorber layer pattern 5a as shown in FIG. 2. At this time, the dry etching was performed with a bias power of 40 W and a source power of 200 W in an atmosphere with a gas pressure of 5 mTorr by a mixed gas of $Cl_2$/He=40/65 sccm.

Here, on a surface 44 of the shock absorbing film 4a, which is a region exposed after removal of the absorber layer 5 except the absorber layer pattern 5a, the reflectivity at a wavelength of 257 nm was 50.83%. On the other hand, the reflectivity at a wavelength of 257 nm on the absorber layer pattern 5a after delamination of the resist pattern 6a was 1.35%. As a result, between the reflected light on the surface 44 of the shock absorbing film 4a in the exposed region and the reflected light on the surface of the absorber pattern 5a, a favorable contrast value of 94.8% was obtained.

Next, the shock absorbing film 4a in the exposed region was removed. That is, a dry etching using a $Cl_2$/$O_2$ mixed gas with the absorber layer pattern 5a as a mask was performed to form a shock absorbing film pattern 4b. Thereby, the reflection type photomask 30 of the present invention shown in FIG. 3 was obtained. At this time, in order to remove every trace of the shock absorbing film 4a in the exposed region in an even manner over the surface, a 30% overetching was performed. An etching amount in the underlying protection film 3 was 1 nm or less, and the selection ratio of the shock absorbing film 4 made from Ru to the protection film 3 made from ZrSi was 18.64. Therefore, the protection film 3 had sufficient resistance.

Finally, the reflectivity at a wavelength of 257 nm was measured on a surface of a reflection region 33 where the absorber layer 5 and the shock absorbing film 4 were removed, and on the absorber pattern 5a. The results were 61.3% and 1.33%, respectively. That is, it was verified that the exposed reflection region 33 had a very high reflectivity and that there was no damage to the multilayer reflection film 2. As a result, between the reflected light on the reflection region 33 and the reflected light on the surface of the absorber pattern 5a, a high contrast value of 95.8% was obtained, and the optical property at a test wavelength (257 nm) was favorable.

As described above, according to the reflection type photomask blank 10, the shock absorbing film 4 and the protection film 3 are provided, making it possible to prevent a decrease in reflectivity of the multilayer reflection film 2 when the absorber layer 5 is etched to form an exposure transfer pattern. Furthermore, according to the reflection type photomask 30 fabricated from the reflection type photomask blank 10, damage to the multilayer reflection film can be prevented to obtain a favorable reflectivity, enabling a pattern transfer with a favorable contrast. That is, such a reflection type photomask 30 enables a microscopic pattern transfer such as with a resolution of 70 nm or less by irradiation of the EUV light.

Second Embodiment

Figure 4:
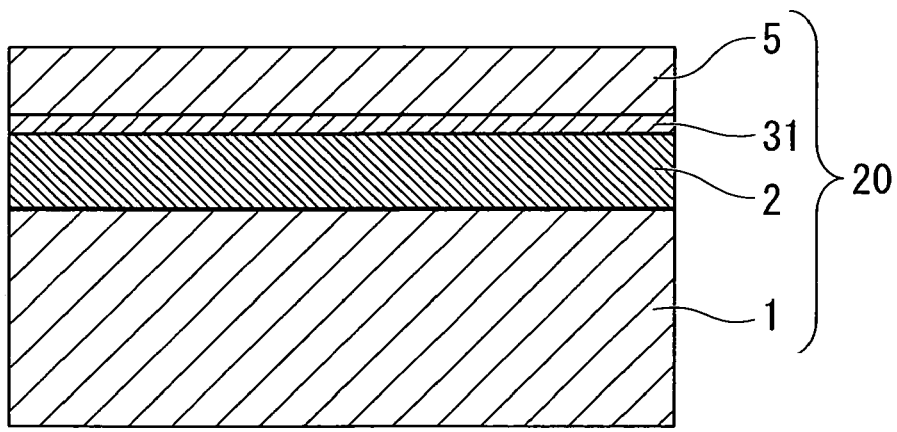
FIG. 4 is a cross-sectional view of a reflection type photomask blank of a second embodiment according to the present invention.
Figure 5:
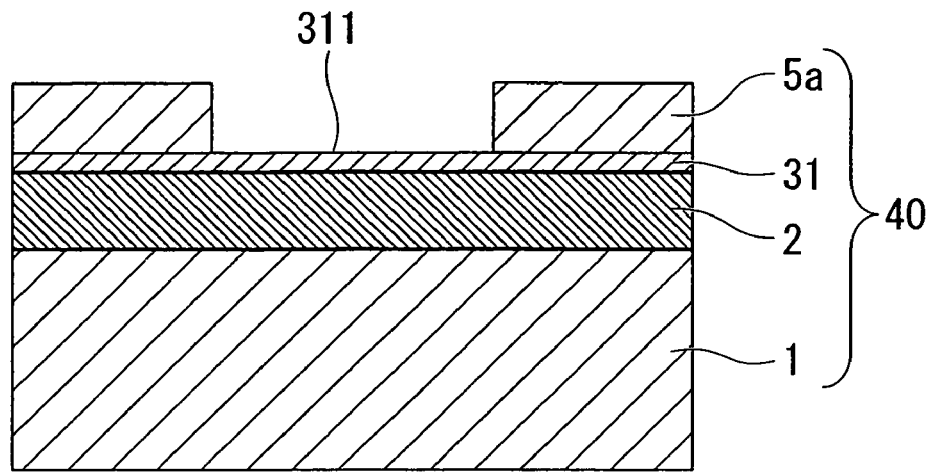
FIG. 5 is a cross-sectional view of a reflection type photomask of the second embodiment according to the present invention.

FIG. 4 and FIG. 5 show a second embodiment according to the present invention. In this embodiment, members in common with those of the aforementioned embodiment are denoted by the same reference symbols, and description thereof is omitted.

A reflection type photomask blank 20 of this embodiment includes: a substrate 1; a multilayer reflection film 2; and an absorber layer 5, and further includes a single-layer dual-use film 31, which serves as the above-mentioned protection film 3 and the above-mentioned shock absorbing film 4, formed between the multilayer reflection film 2 and the absorber layer 5. That is, the dual-use film 31 protects multilayer reflection film 2 and also functions as an etching stopper for preventing damage to the multilayer reflection film 2 when the absorber layer 5 is etched. The dual-use film 31 is formed from: a compound including Zr and Si (ZrSi); a compound including Zr, Si, and at least either one of O and N (for example, ZrSiO and ZrSiN); or a single element or compound including at least any one of Ru, C, and Y (for example, Ru, C, and Y). When formed from for example ZrSi, such a dual-use film 31 is formed by performing a sputtering with a target of a Zr—Si alloy in an inert gas atmosphere such as of Ar. When formed from ZrSiO or ZrSiN, it is formed by performing a sputtering with a target of a Zr—Si alloy in a mixed gas atmosphere of an inert gas such as Ar, and oxygen or nitrogen. When formed from Ru or Y, it is formed by performing a sputtering with a target of Ru or Y in an inert gas atmosphere such as of Ar. Furthermore, when formed from C, it is formed by performing CVD with a material gas.

The absorber layer 5 of such a reflection type photomask blank 20 is dry-etched in an etching atmosphere mainly composed of a chlorine gas, to thereby fabricate a reflection type photomask 40 with an exposure transfer pattern in the absorber layer 5. Hereinunder are a detailed description of the reflection type photomask blank 20 of the present embodiment and a manufacturing method thereof, and a description of the reflection type photomask 40, based on Example 2.

Example 2

In the reflection type photomask blank 20 shown in FIG. 4, the details of a substrate 1 and a multilayer reflection film 2, and a multilayer reflection film formation step, which is a manufacturing step thereof, are omitted because they are similar to those of Example 1.

Next, as a dual-use film formation step, a dual-use film 31 was formed on the multilayer reflection film 2 by the DC magnetron sputtering. That is, a Zr—Si alloy target whose ratio of Zr to Si is 1:2 was used as a sputtering target. To this Zr—Si alloy target, 300 W DC was applied under a mixed gas atmosphere of Ar/$O_2$ with a gas pressure of 0.25 Pa, to thereby deposit a film made from ZrSiO with a thickness of 10 nm. Then, similarly to Example 1, as an absorber layer formation step, an absorber layer 5 was formed, to thereby obtain a reflection type photomask blank 20.

Next, with a mask having a resist pattern formed through the lithography steps of resist coat, EB drawing, and development, a dry etching on the absorber layer 5 was performed in the similar manner to Example 1 to form an absorber pattern 5a. Thereby, a reflection type photomask 40 shown in FIG. 5 was obtained. In the dry etching on the absorber layer 5, a 20% overetching was performed for the purpose of removing every trace of the absorber layer 5 in the exposed region in an even manner over the surface. An etching amount in the dual-use film 31 was 2 nm or less, and the selection ratio of the absorber layer 5 made from the TaSi-based material to the dual-use film 31 made from ZrSiO is 26.50 as shown in TABLE 1. Therefore, the dual-use film 31 had a favorable resistance under a dry etching environment on the absorber layer 5. Finally, the reflectivity at a wavelength of 257 nm was measured on a surface of a reflection region 311 where the absorber layer 5 was removed, and on the absorber pattern 5a. The results were 60.4% and 1.53%, respectively. That is, it was verified that the reflection region 311 had a very high reflectivity and that there was no damage to the multilayer reflection film 2. As a result, between the reflected light on the reflection region 311 and the reflected light on the surface of the absorber pattern 5a, a high contrast value of 95.1% was obtained, and the optical property at a test wavelength (257 nm) was favorable.

Example 3

Figure 6:
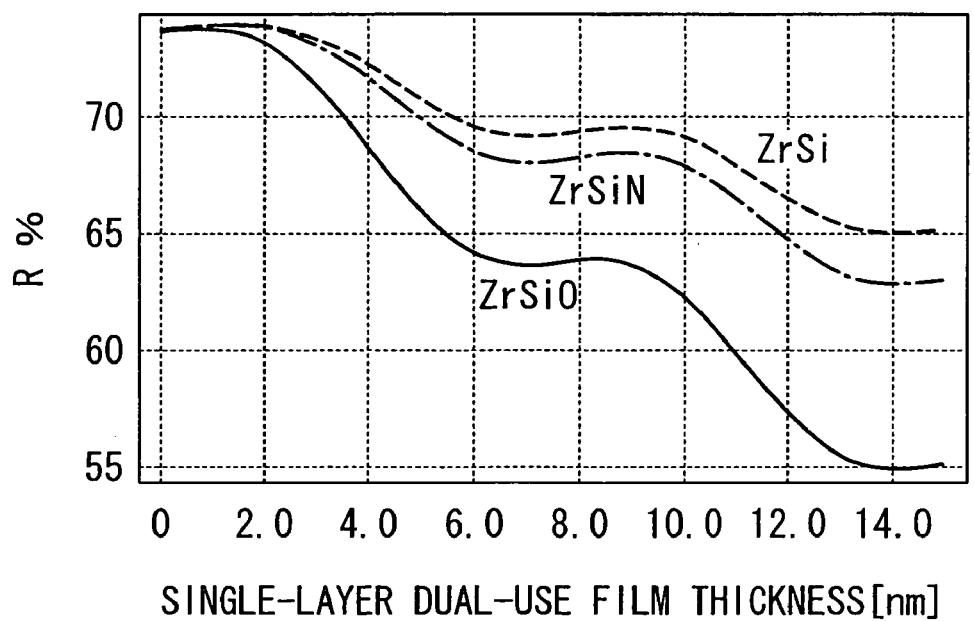
FIG. 6 is a simulation result showing reflectivity profiles of the EUV light with respect to a change in film thickness when compounds respectively of ZrSi and ZrSiO are used in a single layer as a dual-use film in a reflection type photomask of the second embodiment according to the present invention.

Next, with configurations in which ZrSi, ZrSiO, and ZrSiN are respectively deposited in a single layer as the dual-use film 31 on the multilayer reflection film 2, a simulation of an EUV light reflectivity change with respect to a change in thickness of the films of ZrSi, ZrSiO, and ZrSiN was performed. FIG. 6 shows the result. As shown in FIG. 6, as for the transparency for the EUV light, ZrSi has the highest value, followed by ZrSiN and ZrSiO.

That is, from the result shown in FIG. 6 where with use of 10 nm thick single-layer films formed respectively from ZrSi, ZrSiO, and ZrSiN as the dual-use film 31, the EUV wavelength is simulated on the reflection region 311 which is exposed after partial removal of the absorber layer 5 by the etching, it has been shown that the single-layer dual-use film 31 of ZrSi or ZrSiN has a higher EUV light reflectivity than the single-layer dual-use film 31 of ZrSiO. Therefore, it can be verified that the dual-use film 31 made from ZrSi or ZrSiN obtains a high contrast value equivalent to or more than that of the dual-use film 31 made from ZrSiO.

As described above, according to the reflection type photomask blank 20, the dual-use film 31 is provided, making it possible to prevent a decrease in reflectivity when the absorber layer 5 is etched to form an exposure transfer pattern. Furthermore, the protection film and the shock absorbing film are replaced with the single-layered dual-use film 31 which serves as the protection film and the shock absorbing film, allowing the deposition process to be simplified and the film to be thinner.

Furthermore, similarly to the first embodiment, the reflection type photomask 40 fabricated from the reflection type photomask blank 20 enables a pattern transfer with a favorable contrast, and also enables a microscopic pattern transfer such as with a resolution of 70 nm or less by irradiation of the EUV light.

Third Embodiment

Figure 7:
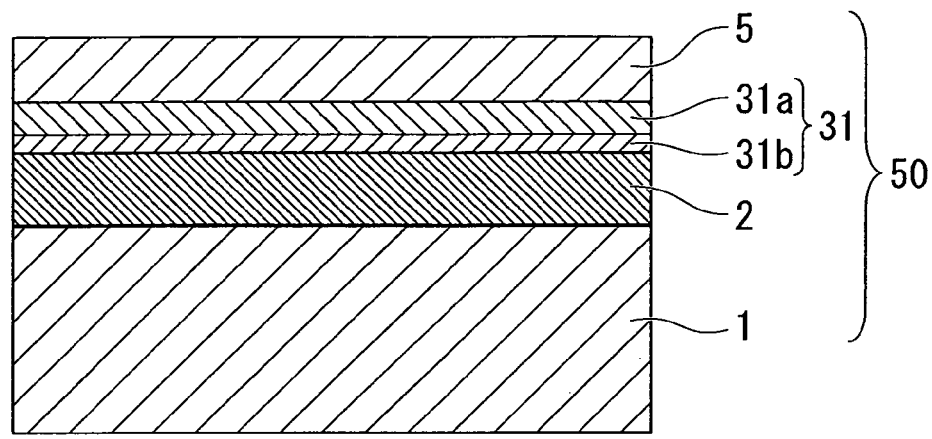
FIG. 7 is a cross-sectional view of a reflection type photomask blank of a third embodiment according to the present invention.
Figure 8:
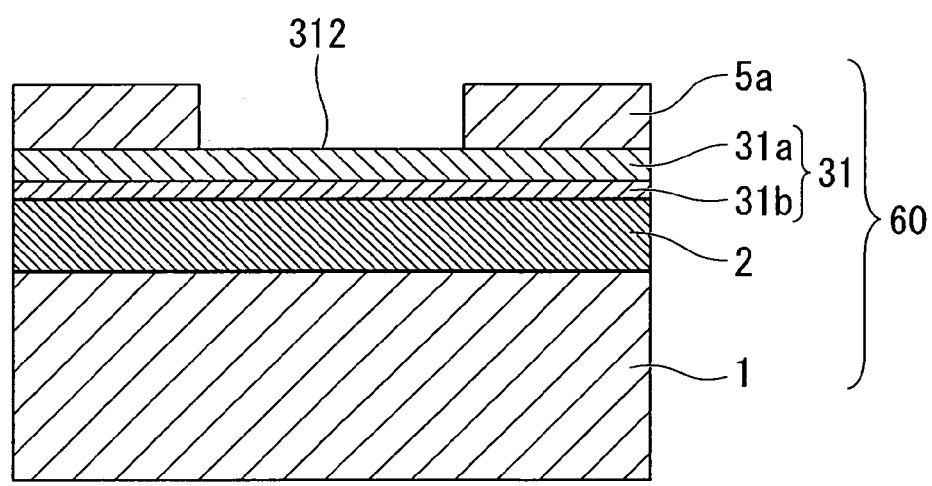
FIG. 8 is a cross-sectional view of a reflection type photomask of the third embodiment according to the present invention.

FIG. 7 and FIG. 8 show a third embodiment according to the present invention. In this embodiment, members in common with those of the aforementioned embodiments are denoted by the same reference symbols, and description thereof is omitted.

A reflection type photomask blank 50 of this embodiment includes: a substrate 1; a multilayer reflection film 2; and an absorber layer 5, and further includes a dual-use film 31, which serves as a protection film 3 and a shock absorbing film 4, formed between the multilayer reflection film 2 and the absorber layer 5. Here, the dual-use film 31 has a laminated configuration of a plurality of dual-use films. In the present embodiment, it is made of two layers of: a dual-use film upper layer 31a and a dual-use film lower layer 31b. If, for example, a material with a high resistance to absorption film etching is deposited as the dual-use film upper layer 31a with a requisite minimum thickness and a material excellent in transmittance for the EUV light is used for the dual-use film lower layer 31b, the dual-use film 31 is allowed to have a more favorable etching resistance while suppressing a decrease in reflectivity of the mask for the EUV light. Here, the dual-use film 31 is formed from: a compound including Zr and Si (ZrSi); a compound including Zr, Si, and at least either one of O and N (for example, ZrSiO and ZrSiN); or a single element or a compound including at least any one of Ru, C, and Y (for example, Ru, C, and Y). The properties of the dual-use film upper layer 31a and the dual-use film lower layer 31b can be controlled by the composition of the above compounds. In addition, the dual-use film 31 is not limited to two layers of the dual-use film upper layer 31a and the dual-use film lower layer 31b, but may be formed of further more layers.

Figure 9:
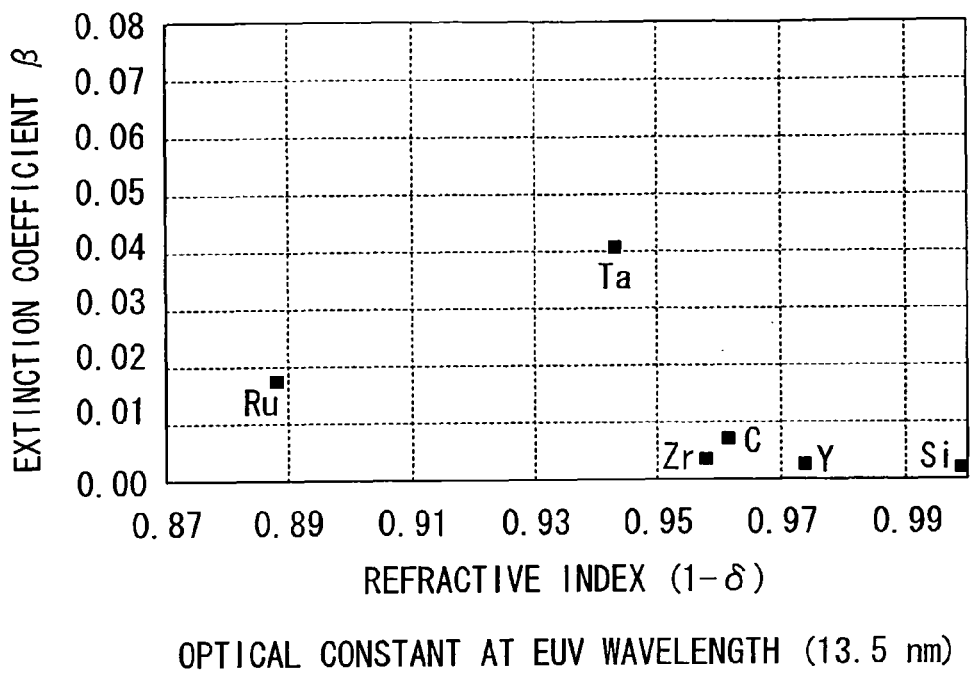
FIG. 9 is a graph in which respective materials are plotted, with the axis of abscissa representing the refractive index for the EUV light (13.5 nm) and the axis of ordinate representing the extinction coefficient for the EUV light (13.5 nm).

FIG. 9 shows optical constants (refractive index and extinction coefficient) of the respective material for the EUV light. TABLE 2 below shows ratios of the etching rates of ZrSi, ZrSiN, ZrSiO, Ru, and C to the etching rate of the EUV light absorption film made from TaSi. If a material with high transmittance for the EUV light is selected for the dual-use film lower layer 31b, and a material with high etching resistance is selected for the dual-use film upper layer 31a with reference to the above figure and table, it is possible to increase a degree of freedom of etching while suppressing a decrease in reflectivity of the EUV light. For example, because TABLE 2 shows that Ru has a high ratio of the etching rate, Ru can be favorably used especially for the dual-use film upper layer 31a. Furthermore, because FIG. 9 shows that Y is a material with a high transmittance for the EUV light, Y can be favorably used especially for the dual-use film lower layer 31b. Hereinunder are a detailed description of the reflection type photomask blank 50 of the present embodiment and a manufacturing method thereof, and a description of the reflection type photomask 60, based on Example 4 to Example 9.

TABLE 2

| To ZrSi | To ZrSiO | To ZrSiN | To Ru | To C |
| --- | --- | --- | --- | --- |
| 20.38 | 26.50 | 31.18 | 33.22 | 26.42 |

Example 4

In the reflection type photomask blank 50 shown in FIG. 7, the details of a substrate 1 and a multilayer reflection film 2, and a multilayer reflection film formation step, which is a manufacturing step thereof, are omitted because they are similar to those of Example 1.

Next, as a dual-use film formation step, a dual-use film upper layer 31a and a dual-use film lower layer 31b were formed on a multilayer reflection film 2. At this time, the dual-use film upper layer 31a was a ZrSiO film. As shown in TABLE 2, ZrSiO has a high resistance to etching. Furthermore, the dual-use film lower layer 31b was a ZrSi film. As shown in FIG. 9, both Zr and Si have a high transparency for the EUV wavelength.

The dual-use film upper layer 31a and the dual-use film lower layer 31b were fabricated by the DC magnetron sputtering respectively under the following conditions.

First, for the deposition of a dual-use film lower layer 31b, a Zr—Si alloy target whose ratio of Zr to Si is 1:3 was used as a sputtering target. To this Zr—Si alloy target, 300 W DC was applied under an Ar atmosphere with a gas pressure of 0.25 Pa, to thereby deposit a film with a thickness of 5 nm.

Next, for the deposition of a dual-use film upper layer 31a, a $ZrSi_2$ target was used as a sputtering target. To this $ZrSi_2$ target, 300 W DC was applied under an Ar atmosphere with a gas pressure of 0.25 Pa to which was added $O_2$ to deposit a film with a thickness of 5 nm.

Next, similarly to Example 1, as an absorber layer formation step, an absorber layer 5 was formed, to thereby obtain a reflection type photomask blank 50.

At this time, the topmost surface of the reflection type photomask blank 50 in the absorber layer 5 had a surface roughness of 0.38 nmRms, and hence had a favorable surface smoothness. The results of the measurement of the reflectivity on the surface of the absorber layer 5 were 2.15% at a wavelength of 193 nm and 1.21% at a wavelength of 257 nm. Therefore, a sufficiently low reflectivity property in the DUV light wavelength region for a test was obtained.

Next, with a mask of having a resist pattern formed through the lithography steps of resist coat, EB drawing, and development, a dry etching on the absorber layer 5 was performed in the similar manner to Example 1 to form an absorber pattern 5a. Thereby, a reflection type photomask 60 shown in FIG. 8 was obtained.

At this time, in order to remove every trace of the absorber layer 5 in a reflection region 312 in an even manner over the surface, a 30% overetching was performed. An etching amount in the underlying dual-use film upper layer 31a made from ZrSiO was 1 m or less, and the selection ratio to TaSi was 26.50. Therefore, the dual-use film upper layer 31a had a sufficient resistance.

The reflectivity of a test wavelength at 257 nm on the reflection region 312 which was exposed after partial removal of the absorber layer 5 was 50.11%. On the other hand, the reflectivity at 257 nm on the surface of the absorber pattern 5a of the photomask 60 of FIG. 8 after delamination of the resist pattern 6a was ~1.35%. As a result, between the reflected light on the reflection region 312 and the reflected light on the surface of the absorber pattern 5a, a favorable contrast value of 94.7% was obtained, and the optical property at a test wavelength (257 nm) was favorable.

Example 5

Figure 10:
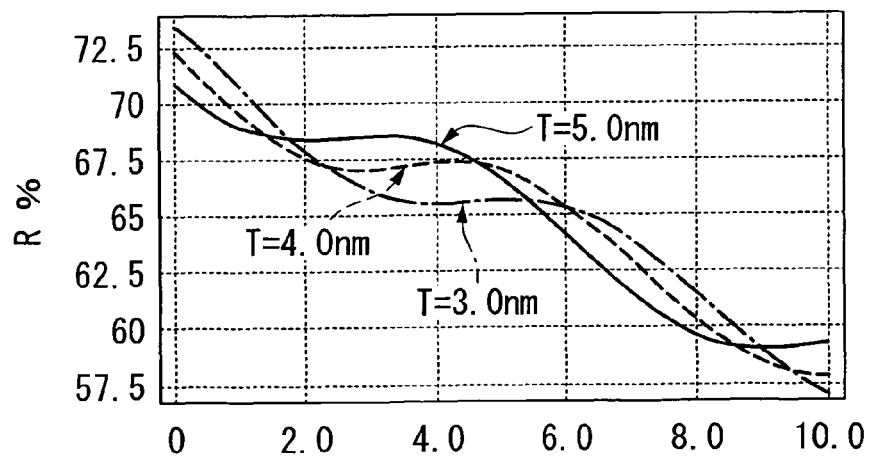
FIG. 10 is a simulation result showing reflectivity profiles of the EUV light when a film thickness of ZrSiO, which is deposited as a dual-use film upper layer respectively on the three types of ZrSi deposited as a dual-use film lower layer with thicknesses of 3.0, 4.0, and 5.0 nm, is changed in the reflection type photomask of the third embodiment according to the present invention.

FIG. 10 is a simulation results of the reflectivity for the EUV wavelength on the reflection region 312 which is exposed after partial removal of the absorber layer 5 by etching, in the case where the dual-use film 31 of the present invention has a laminated configuration of the dual-use film lower layer 31b and the dual-use film upper layer 31a. As shown in FIG. 10, a result has been shown that by making the thickness of the ZrSiO film as the dual-use film upper layer 31a 4.0 nm or less when the ZrSi film as the dual-use film lower layer 31b has a thickness of 5.0 nm, it is theoretically possible to obtain a reflectivity over 67.5% for the EUV light.

Example 6

Similarly to Example 4, as a dual-use film formation step, a dual-use film upper layer 31a and a dual-use film lower layer 31b were formed on a multilayer reflection film 2.

In the present example, the dual-use film upper layer 31a was a ZrSiN film. As shown in TABLE 2, ZrSiN has a high resistance to etching. Furthermore, the dual-use film lower layer 31b was a ZrSi film. As shown in FIG. 9, both Zr and Si have a high transparency for the EUV wavelength.

The dual-use film upper layer 31a and the dual-use film lower layer 31b were fabricated by the DC magnetron sputtering respectively under the following conditions.

First, for the deposition of a dual-use film lower layer 31b, a Zr—Si alloy target whose ratio of Zr to Si is 1:3 was used as a sputtering target. To this Zr—Si alloy target, 300 W DC was applied under an Ar atmosphere with a gas pressure of 0.25 Pa, to thereby deposit a film with a thickness of 5 nm.

Next, for the deposition of a dual-use film upper layer 31a, a ZrSi$_2$ target was used as a sputtering target. To this ZrSi$_2$ target, 300 W DC was applied under an Ar atmosphere with a gas pressure of 0.25 Pa to which was added N$_2$, to thereby deposit a film with a thickness of 5 nm.

Next, similarly to Example 1, as an absorber layer formation step, an absorber layer 5 was formed, to thereby obtain a reflection type photomask blank 50.

At this time, the topmost surface of the reflection type photomask blank 50 in the absorber layer 5 had a surface roughness of 0.40 nm rms, and hence had a favorable surface smoothness. The results of the measurement of the reflectivity on the surface of the absorber layer 5 were 2.18% at a wavelength of 193 nm and 1.25% at a wavelength of 257 nm. Therefore, a sufficiently low reflectivity property in the DUV light wavelength region for a test was obtained.

Next, with a mask having a resist pattern formed through the lithography steps of resist coat, EB drawing, and development, a dry etching on the absorber layer 5 was performed in the similar manner to Example 1 to form an absorber pattern 5a. Thereby, a reflection type photomask 60 shown in FIG. 8 was obtained.

At this time, in order to remove every trace of the absorber layer 5 in a reflection region 312 in an even manner over the surface, a 30% overetching was performed. An etching amount in the underlying dual-use film upper layer 31a made from ZrSiN was 1 nm or less, and the selection ratio to TaSi was 31.18. Therefore, the dual-use film upper layer 31a had a sufficient resistance.

The reflectivity of a test wavelength at 257 nm on the reflection region 312 which was exposed after partial removal of the absorber layer 5 was 51.47%. On the other hand, the reflectivity at 257 nm on the surface of the absorber pattern 5a of the photomask 60 of FIG. 8 after delamination of the resist pattern 6a was 1.38%. As a result, between the reflected light on the reflection region 312 and the reflected light on the surface of the absorber pattern 5a, a favorable contrast value of 94.7% was obtained, and the optical property at a test wavelength (257 nm) was favorable.

Example 7

Similarly to Example 4, as a dual-use film formation step, a dual-use film upper layer 31a and a dual-use film lower layer 31b were formed on a multilayer reflection film 2.

In the present example, the dual-use film upper layer 31a was a Ru film. As shown in TABLE 2, Ru has a high resistance to etching. Furthermore, the dual-use film lower layer 31b was a ZrSi film. As shown in FIG. 9, both Zr and Si have a high transparency for the EUV wavelength.

The dual-use film upper layer 31a and the dual-use film lower layer 31b were fabricated by the DC magnetron sputtering respectively under the following conditions.

First, for the deposition of a dual-use film lower layer 31b, a Zr—Si alloy target whose ratio of Zr to Si is 1:3 was used as a sputtering target. To this Zr—Si alloy target, 300 W DC was applied under an Ar atmosphere with a gas pressure of 0.25 Pa, to thereby deposit a film with a thickness of 5 nm.

Next, for the deposition of a dual-use film upper layer 31a, a Ru target was used as a sputtering target. To this Ru target, 300 W DC was applied under an Ar atmosphere with a gas pressure of 0.25 Pa, to thereby deposit a film with a thickness of 2 nm n.

Next, similarly to Example 1, as an absorber layer formation step, an absorber layer 5 was formed, to thereby obtain a reflection type photomask blank 50.

At this time, the topmost surface of the reflection type photomask blank 50 in the absorber layer 5 had a surface roughness of 0.37 nmRms, and hence had a favorable surface smoothness. The results of the measurement of the reflectivity on the surface of the absorber layer 5 were 2.22% at a wavelength of 193 nm and 1.24% at a wavelength of 257 nm. Therefore, a sufficiently low reflectivity property in the DUV light wavelength region for a test was obtained.

Next, with a mask having a resist pattern formed through the lithography steps of resist coat, EB drawing, and development, a dry etching on the absorber layer 5 was performed in the similar manner to Example 1 to form an absorber pattern 5a. Thereby, a reflection type photomask 60 shown in FIG. 8 was obtained.

At this time, in order to remove every trace of the absorber layer 5 of a reflection region 312 in an even manner over the surface, a 30% overetching was performed. An etching amount in the underlying dual-use film upper layer 31a made from Ru was 1 nm or less, and the selection ratio to TaSi was 33.22. Therefore, the dual-use film upper layer 31a had a sufficient resistance.

The reflectivity of a test wavelength at 257 nm on the reflection region 312 which was exposed after partial removal of the absorber layer 5 was 50.33%. On the other hand, the reflectivity at 257 nm on the surface of the absorber pattern 5a of the photomask 60 of FIG. 8 after delamination of the resist pattern 6a was 1.33%. As a result, between the reflected light on the reflection region 312 and the reflected light on the surface of the absorber pattern 5a, a favorable contrast value of 94.8% was obtained, and the optical property at a test wavelength (257 nm) was favorable.

Example 8

Similarly to Example 4, as a dual-use film formation step, a dual-use film upper layer 31a and a dual-use film lower layer 31b were formed on a multilayer reflection film 2.

The dual-use film upper layer 31a was a C film. As shown in TABLE 2, C has a high resistance to etching. Furthermore, the dual-use film lower layer 31b was a ZrSi film. As shown in FIG. 9, both Zr and Si have a high transparency for the EUV wavelength.

The dual-use film upper layer 31a and the dual-use film lower layer 31b were fabricated under the following conditions.

First, for the deposition of a dual-use film lower layer 31b, a Zr—Si alloy target whose ratio of Zr to Si is 1:3 was used as a sputtering target. To this Zr—Si alloy target, 300 W DC was applied under an Ar atmosphere with a gas pressure of 0.25 Pa, to thereby deposit a film with a thickness of 5 nm.

Next, a parallel-plate plasma CVD apparatus was used to form a dual-use film upper layer 31a, which was a diamond-shaped carbon thin film, on the dual-use film lower layer 31b. The conditions for the plasma CVD were that a gas whose major component was methane (flow rate: 20 sccm) was used as a material gas, and that a gas including nitrogen (concentration: 1 to 50%) was used as a doping gas. In addition, a reaction pressure was set to 0.03 Torr, and a self-bias voltage was set to 0 to 1500 V. As a result, the dual-use film upper layer 31a with a thickness of 5 nm was deposited.

Next, similarly to Example 1, as an absorber layer formation step, an absorber layer 5 was formed, to thereby obtain a reflection type photomask blank 50.

At this time, the topmost surface of the reflection type photomask blank 50 in the absorber layer 5 had a surface roughness of 0.39 nmRms, and hence had a favorable surface smoothness. The results of the measurement of the reflectivity on the surface of the absorber layer 5 were 2.15% at a wavelength of 193 nm and 1.21% at a wavelength of 257 nm. Therefore, sufficiently low reflectivity property in the DUV light wavelength region for a test was obtained.

Next, with a mask having a resist pattern formed through the lithography steps of resist coat, EB drawing, and development, a dry etching on the absorber layer 5 was performed in the similar manner to Example 1 to form an absorber pattern 5a. Thereby, a reflection type photomask 60 shown in FIG. 8 was obtained.

At this time, in order to remove every trace of the absorber layer 5 of a reflection region 312 in an even manner over the surface, a 30% overetching was performed. An etching amount in the underlying dual-use film upper layer 31a made from C was 1.5 nm or less, and the selection ratio to TaSi was 26.42. Therefore, the underlying dual-use film upper layer 31a had a sufficient resistance.

The reflectivity of a test wavelength at 257 nm on the reflection region 312 which was exposed after partial removal of the absorber layer 5 was 50.01%. On the other hand, the reflectivity at 257 nm on the surface of the absorber pattern 5a of the photomask 60 of FIG. 8 after delamination of the resist pattern 6a was 1.53%. As a result, between the reflected light on the reflection region 312 and the reflected light on the surface of the absorber pattern 5a, a favorable contrast value of 94.1% was obtained, and the optical property at a test wavelength (257 nm) was favorable.

Example 9

Similarly to Example 4, as a dual-use film formation step, a dual-use film upper layer 31a and a dual-use film lower layer 31b were formed on a multilayer reflection film 2.

In the present example, the dual-use film upper layer 31a was a Ru film. As shown in TABLE 2, Ru has a high resistance to etching. Furthermore, the dual-use film lower layer 31b was a C film. As shown in FIG. 9, C has a high transparency for the EUV wavelength.

The dual-use film upper layer 31a and the dual-use film lower layer 31b were fabricated respectively under the following conditions.

First, a parallel-plate plasma CVD apparatus was used to form a dual-use film lower layer 31b which was a diamond-shaped carbon thin film. The conditions for the plasma CVD were that a gas whose major component was methane (flow rate: 20 sccm) was used as a material gas, and that a gas including nitrogen (concentration: 1 to 50%) was used as a doping gas. In addition, a reaction pressure was set to 0.03 Torr, and a self-bias voltage was set to 0 to 1500 V. As a result, the dual-use film lower layer 31b with a thickness of 5 nm was deposited.

Next, for the deposition of a dual-use film upper layer 31a, a Ru target was used as a sputtering target. To this Ru target, 300 W DC was applied under an Ar atmosphere with a gas pressure of 0.25 Pa, to thereby deposit a film with a thickness of 2 nm.

Next, similarly to Example 1, as an absorber layer formation step, an absorber layer 5 was formed, to thereby obtain a reflection type photomask blank 50.

At this time, the topmost surface of the reflection type photomask blank 50 in the absorber layer 5 had a surface roughness of 0.41 nm rms, and hence had a favorable surface smoothness. The results of the measurement of the reflectivity on the surface of the absorber layer 5 were 2.22% at a wavelength of 193 nm and 1.24% at a wavelength of 257 nm. Therefore, a sufficiently low reflectivity property in the DUV light wavelength region for a test was obtained.

Next, with a mask having a resist pattern formed through the lithography steps of resist coat, EB drawing, and development, a dry etching on the absorber layer 5 was performed in the similar manner to Example 1 to form an absorber pattern 5a. Thereby, a reflection type photomask 60 shown in FIG. 8 was obtained.

At this time, in order to remove every trace of the absorber layer 5 of a reflection region 312 in an even manner over the surface, a 30% overetching was performed. An etching amount in the underlying dual-use film upper layer 31a made from Ru, which serves as a foundation layer, was 1.5 nm or less, and the selection ratio to TaSi was 33.22. Therefore, the dual-use film upper layer 31a had a sufficient resistance.

The reflectivity of a test wavelength at 257 nm on the reflection region 312 which was a region exposed after partial removal of the absorber layer 5 was 49.89%. On the other hand, the reflectivity at 257 nm on the surface of the absorber pattern 5a of the photomask 60 of FIG. 8 after delamination of the resist pattern 6a was 1.33%. As a result, between the reflected light on the reflection region 312 and the reflected light on the surface of the absorber pattern 5a, a favorable contrast value of 94.8% was obtained, and the optical property at a test wavelength (257 nm) was favorable.

As described above, according to the reflection type photomask blank 50, the dual-use film 31 has a laminated configuration of a plurality of layers, making it possible to prevent a decrease in reflectivity when the absorber layer 5 is etched to form an exposure transfer pattern. Furthermore, the laminated configuration allows the dual-use film 31 to sufficiently have both of etching resistance and transmittance for the EUV light.

Furthermore, similarly to the first embodiment, the reflection type photomask 60 fabricated from the reflection type photomask blank 50 enables a pattern transfer with a favorable contrast, and also enables a microscopic pattern transfer such as with a resolution of 70 nm or less by irradiation of the EUV light.

Furthermore, in the manufacture of a semiconductor device, by use of any of these reflection type photomasks 30, 40, and 60 as described in the above embodiments, a microscopic pattern with a resolution of 70 nm or less can be transferred to manufacture a semiconductor device. That is, as a transfer step, the EUV light as exposure light is irradiated onto the reflection type photomask 30 (40, 60). The reflected light reflected on the multilayer reflection film 2 of the reflection type photomask 30 (40, 60) exposes a resist layer provided on a semiconductor substrate, allowing a range corresponding to the wavelength of the irradiated EUV light, that is, a microscopic pattern with a resolution of 70 nm or less to be transferred with a favorable contrast. Therefore, in the manufacturing method of a semiconductor device with such a transfer step, it is possible to manufacture a semiconductor device subjected to micromachining at 70 nm or less which corresponds to the wavelength of the EUV light as exposure light.

While embodiments of the invention have been described in detail above with reference to the drawings, the specific configurations of the invention are not limited to these embodiments, and include design modifications and the like insofar as they do not depart from the spirit or scope of the invention.

INDUSTRIAL APPLICABILITY

The reflection type photomask blank of the present invention is applicable for preventing a decrease in reflectivity when an absorber layer is etched to from an exposure transfer pattern. Furthermore, the reflection type photomask of the present invention is applicable for preventing damage to a multilayer reflection film to obtain a favorable reflectivity, enabling a pattern transfer with a favorable contrast.

The invention claimed is:

1. A reflection type photomask blank, comprising:
a substrate;
a multilayer reflection film, formed on the substrate, to reflect exposure light;
an absorber layer to absorb the exposure light; and
a dual-use film layer formed between the absorber layer and the multilayer reflection film, wherein
the dual-use film comprises a dual-use film upper layer and a dual-use film lower layer,
the dual-use film upper layer and the dual-use film lower layer are ZrSiO film and ZrSi film, ZrSiN film and ZrSi film, or C film and ZrSi film, respectively, and
a thickness of the dual-use film lower layer is 3.0 to 5.0 nm.

2. The reflection type photomask blank according to claim 1, wherein
the dual-use film comprises a plurality of the dual-use film upper layers and the dual-use film lower layers; and a topmost layer of the dual-use film upper layers has an etching rate of 1/20 or less than that of the absorber layer when the absorber layer is etched to form an exposure transfer pattern.

3. The reflection type photomask blank according to claim 1, wherein
the dual-use film comprises a plurality of the dual-use film upper layers and the dual-use film lower layers;
an uppermost layer of the dual-use film upper layers in a thickness direction of the substrate comprises: a compound including Zr, Si, and at least either one of O and N, and
a lowermost layer of the dual-use film lower layers in the thickness direction of the substrate comprises a compound including Zr and Si.

4. The reflection type photomask blank according to claim 1, wherein
the dual-use film comprises a plurality of the dual-use film upper layers and the dual-use film lower layers,
an uppermost layer of the dual-use film upper layers in a thickness direction of the substrate comprises: a compound including Zr, Si, and at least either one of O and N, and
a lowermost layer of the dual-use film lower layers in the thickness direction of the substrate comprises a compound including Zr and Si.

5. A reflection type photomask, wherein an exposure transfer pattern is formed by etching an absorber layer of the reflection type photomask blank according to claim 1.

6. A manufacturing method of a semiconductor device, comprising transferring the pattern of the absorber layer of the reflection type photomask according to claim 5 onto a resist layer provided on a semiconductor substrate by irradiating extreme ultraviolet light as the exposure light onto the reflection type photomask to expose reflected light reflected on the multilayer reflection film of the reflection type photomask onto the resist layer.

7. A manufacturing method of a reflection type photomask blank provided with: a substrate; a multilayer reflection film for reflecting exposure light; and an absorber layer for absorbing the exposure light, comprising:
forming a multilayer reflection film on the substrate;
laminating a dual-use film on the multilayer reflection film; and
forming the absorber layer on the dual-use films, wherein
the dual-use film comprises a dual-use film upper layer and a dual-use film lower layer,
the dual-use film upper layer and the dual-use film lower layer are ZrSiO film and ZrSi film, ZrSiN film and ZrSi film, or C film and ZrSi film, respectively, and
a thickness of the dual-use film lower layer is 3.0 to 5.0 nm.

8. The manufacturing method of a reflection type photomask blank according to claim 7, wherein
the dual-use film comprises a plurality of the dual-use film upper layers and the dual-use film lower layers,
an uppermost layer of the dual-use film upper layers in a thickness direction of the substrate comprises: a compound including Zr and Si, and at least either one of O and N, and
a lowermost layer of the dual-use film lower layers in the thickness direction of the substrate comprises a compound including Zr and Si.

9. A reflection type photomask, wherein an exposure transfer pattern is formed by etching an absorber layer of a reflection type photomask blank which is manufactured with the manufacturing method of a reflection type photomask blank according to claim 7.

10. A manufacturing method of a semiconductor device, comprising transferring the pattern of the absorber layer of the reflection type photomask according to claim 9 onto a resist layer provided on a semiconductor substrate by irradiating extreme ultraviolet light as the exposure light onto the reflection type photomask to expose reflected light reflected on the multilayer reflection film of the reflection type photomask onto the resist layer.

* * * * *